(12) United States Patent
Freund et al.

(10) Patent No.: US 6,185,816 B1
(45) Date of Patent: Feb. 13, 2001

(54) ALIGNMENT METHOD

(75) Inventors: Joseph M. Freund, Fogelsville; George J. Przybylek, Douglasville; Dennis M. Romero, Bethlehem, all of PA (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/348,656

(22) Filed: Jul. 6, 1999

(51) Int. Cl.[7] ............................................. H05K 3/30
(52) U.S. Cl. ...................... 29/833; 29/832; 29/740; 29/743; 257/797; 382/151
(58) Field of Search .................... 29/833, 832, 840, 29/740, 846, 743; 901/9; 382/149, 151, 145; 257/797, 433; 414/729, 815

(56) References Cited

U.S. PATENT DOCUMENTS

| | | |
|---|---|---|
| 5,443,354 * 8/1995 | Stone et al. | 414/729 |
| 5,578,156   11/1996 | Kamakura et al. . | |
| 5,612,787    3/1997 | Harvey et al. . | |
| 5,680,698 * 10/1997 | Armington et al. | 29/833 |
| 5,743,731    4/1998 | Lares et al. . | |
| 5,946,409 *  8/1999 | Hori | 382/149 |
| 5,998,878 * 12/1999 | Johnson | 257/797 |

\* cited by examiner

*Primary Examiner*—Lee Young
*Assistant Examiner*—Rick Kiltae Chang
(74) *Attorney, Agent, or Firm*—Dickstein Shapiro Morin & Oshinsky LLP

(57) ABSTRACT

A system for handling semiconductor workpieces, by aligning a movable pick and place device and a movable optical control device, is disclosed. The system and method provide for the formation of an imprint by the pick and place device. The optical control device can then be aligned to that imprint, creating alignment between the pick and place device and the optical control device. Once alignment is complete the imprinted material may be replaced with one or more semiconductor workpieces. The system provides precise, repeatable alignment between the pickup point for the pick and place device and the optical control device.

11 Claims, 2 Drawing Sheets

ALIGNMENT METHOD

BACKGROUND OF THE INVENTION

I. Field of the Invention

The present invention relates generally to manufacturing systems that use pick and place equipment to handle small components. More specifically, the invention relates to an apparatus and method for aligning a camera to an imprint in a film layer which represents an attach position on a semiconductor workpiece, where a pick and place device picks up the semiconductor workpiece.

II. Description of the Related Art

In the assembly of semiconductor products, relatively small parts or components are picked up and accurately placed in another location. For example, in the assembly of optoelectronic systems, it may be necessary to accurately orient and align optical components, such as semiconductor lasers. In a known pick and place system, an operator manually aligns a vacuum collet with respect to an optical camera. These two devices working together are used to move a workpiece in the manufacturing process. The workpiece may be a chip, a bar, a wafer, etc.

In the known system, a test piece is located below the downward looking camera. Crosshairs, viewed on a monitor, are used to align the camera with an attach position on the test piece, which will be the actual attach position on a semiconductor workpiece in the manufacturing process. The attach position may be near the center of the test piece, which in turn would represent the center of a workpiece, for example. The vacuum collet is then moved over the test piece and lowered until it is slightly above the test piece, near the attach position. The operator then adjusts the position of the collet using x and y coordinates until it appears that it is aligned to what the camera perceives as the attach position. Lastly, the test piece is replaced with an actual semiconductor workpiece.

This manual alignment is performed at an angle and by human eye, thus making the process cumbersome, potentially inaccurate and unrepeatable. Inaccuracy in the procedure will result in the collet being placed some distance from where it was intended to be placed. The margin of error may be defined as the difference between the actual attach position, where the vacuum collet picks up a workpiece, and where the optical collection device perceives the attach position to be.

There exists a need for a pick and place system that provides precise, repeatable and efficient alignment between the pick and place equipment and the camera, such that what is seen by the camera as the attach position is aligned to the actual attach position, where the vacuum collet picks up the workpiece. Such precision will help ensure that the workpiece is ultimately placed in the correct location.

SUMMARY OF THE INVENTION

The present invention relates to a system for handling a semiconductor workpiece, such as a semiconductor chip, laser bar, wafer and the like. The system includes a pick and place device for accurately moving the semiconductor workpiece. The pick and place device is arranged to form an imprint on a film layer to align an optical device. In addition, the system has a control device for moving the pick and place device to a remote location away from the imprint, and an optical device for viewing the imprint while the pick and place device is at the remote location.

According to one aspect of the invention, a device may be provided for aligning the optical device with respect to the imprint on the film layer while the pick and place device is in the remote location.

According to another aspect of the invention, the movement of the pick and place device is controlled in response to the location of the imprint on the film layer.

In a preferred embodiment of the invention, the optical device may be a vision camera with suitable vision control software. The present invention should not be limited, however, to the preferred embodiments described and shown in detail herein.

If desired, the pick and place device may have a source of vacuum and a vacuum collet. In a preferred embodiment of the invention, the pick and place device has an annular tip for forming the imprint on the film layer.

According to another aspect of the invention, the imprint is formed in a film layer provided on a film support. The film layer may be formed, for example, of adhesive tape.

The present invention also relates to a system for aligning a camera, or other optical collection device, to an imprint of a vacuum pick and place device. Thus, the present invention may be used to align the camera to the actual attach position of the pick and place device in a precise, repeatable and efficient manner.

According to another aspect of the invention, the vacuum pick and place device is moved over the film layer to a first (x,y) position, predetermined to be the attach position's coordinates. Once locked into the first position, the vacuum pick and place device then descends on the attach position and makes an imprint of the head of the vacuum pick and place device on the film layer. The vacuum pick and place device then ascends from the film layer and is released from the first position and moved out of the way to a second position.

Then, the optical collection device is aligned to the imprint of the vacuum pick and place device on the film layer. By doing so the optical collection device becomes aligned to the vacuum pick and place device pick up point. This may be accomplished relatively easily by an operator viewing the imprint on a monitor and accurately aligning the crosshairs to the imprint of the vacuum pick and place device on the film layer. The pick and place device is then brought back in and locked into its first (x,y) position where imprinting occurred. Thus, the optical collection and reproduction device and the vacuum pick and place device pick up point are in alignment using the imprint as a reference point employing devices and a methodology which can be replicated.

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

Figure 1:
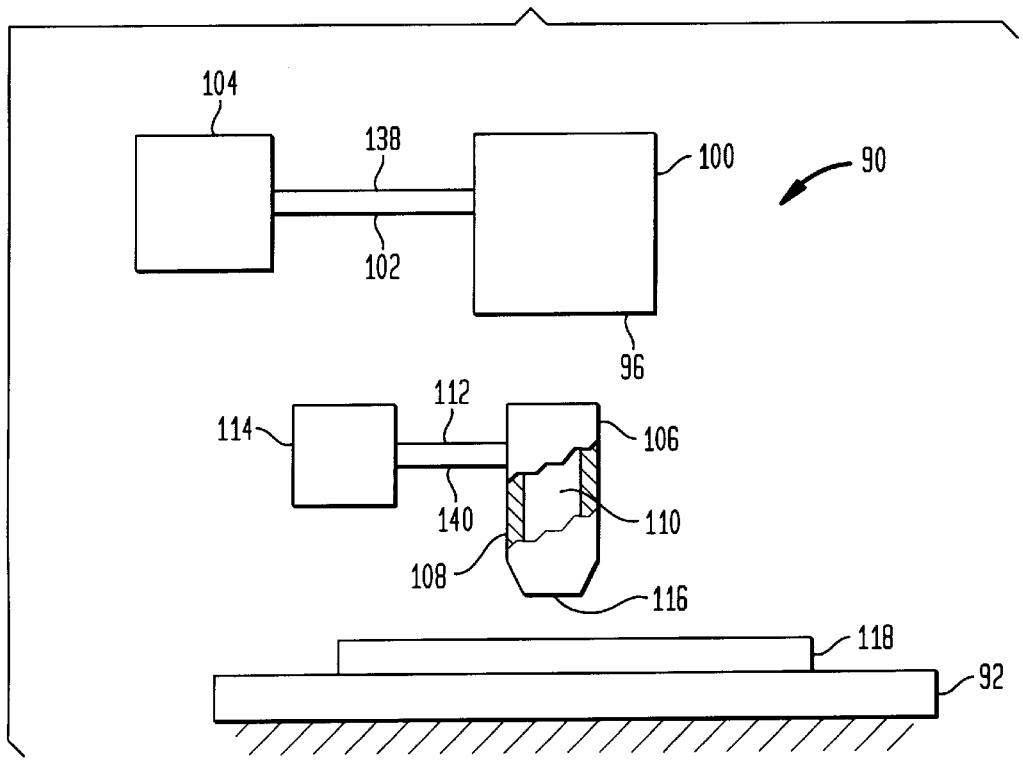
FIG. 1 is a side view of a pick and place system constructed in accordance with a preferred embodiment of the present invention.

Referring now to the drawings, where like reference numerals designate like elements, there is shown in FIG. 1 a system 90 for moving a semiconductor workpiece (not illustrated). The system 90 includes a vacuum collet 106 for picking and placing the workpiece, and a vision camera 100 for displaying a magnified image of the attach position on a film layer 118. The film layer 118 is supported on a support structure 92.

In the FIG. 1 position, the vision camera 100 is positioned above the vacuum collet 106 and the support structure 92. The vision camera 100, which is capable of imaging an imprint, is connected to a vision control system 104 by a signal line 102 and an operative arm 138. The vision control system 104 controls the operative arm 138 and receives signals from the camera 100 via the signal line 102. The vision control system 104 may be controlled by suitable vision software. The operative arm 138, controlled by the control system 104, may be used to support the camera 100 in the desired position, and to move the camera 100 as desired. The present invention should not be limited to the system shown and described in detail herein. In an alternative embodiment, for example, another suitable vision or sensing device may be used in place of the vision camera 100.

The vacuum collet 106 is connected to an operative arm 140 and a vacuum tube 112. The operative arm 140 and vacuum conduit 112 are connected to a pick and place control system 114. The pick and place control system 114 controls the operative arm 140 and provides a source of vacuum for the vacuum conduit 112. The vacuum collet 106 has an internal vacuum tube 110. The vacuum conduit 112 is operatively connected to the internal vacuum tube 110. The internal vacuum tube 110 is coaxially aligned within the outer surface 108 of the vacuum coliet 106. The internal vacuum tube 110 and the outer surface 108 of the vacuum collet 106 form a cylindrical tip 116. The tip 116 provides a discrete pick up point where the device 106 is attached by vacuum to the workpiece.

The invention should not be limited to the pick and place equipment 114, 112, 140, 106 described in detail above. In an alternative embodiment of the invention, the pick and place device may have a rectangular configuration, for example.

The illustrated film layer 118 may be affixed to the support structure 92. The film layer 118 may be tape, or another material which is capable of maintaining an imprint. Preferably the film layer 118 is adhesively connected to the support structure 92. In a preferred embodiment of the invention, the support structure 92 may include a flexible sheet for supporting the workpiece. The top of the film layer 118 faces the vacuum collet 106 and the vision camera 100. In the illustrated embodiment, the iris 96 of the vision camera 100 and the tip 116 of the pick and place collet 106 are both pointed downward toward the film layer 118.

Figure 2:
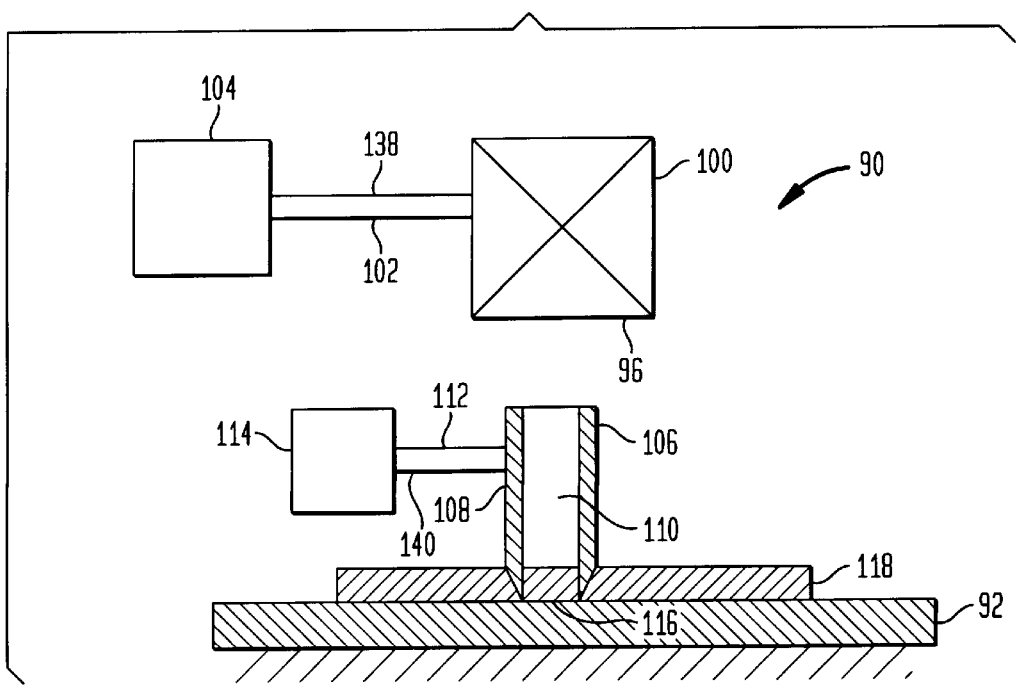
FIG. 2 is a cross sectional view of the system of FIG. 1, at a subsequent stage of operation.
Figure 4:
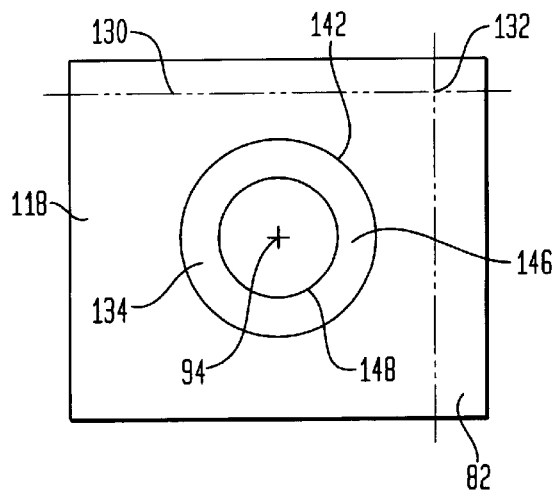
FIG. 4 is a top view of a film layer for the system of FIG. 1.

In operation, the operative arm 140 moves the vacuum collet 106 under the vision camera 100 and above the film layer 118 to the position shown in FIG. 1. In the FIG. 1 position, the vacuum collet 106 is located directly above the desired attach position 94 (FIG. 4). The attach position 94 may be, for example, at the center of the film layer 118. The vacuum collet 106 is then lowered by the pick and place control system 114 onto the film layer 118 to the position shown in FIG. 2.

Preferably, the collet 106 is moved with sufficient pressure to make a direct imprint 134 (FIG. 3) of the cylindrical tip 116 of the vacuum collet 106 in the film layer 118, at the attach position 94. In the FIG. 2 position, the tip 116 of the vacuum collet 106 is slightly above the top surface 142 of the film support 92.

Figure 3:
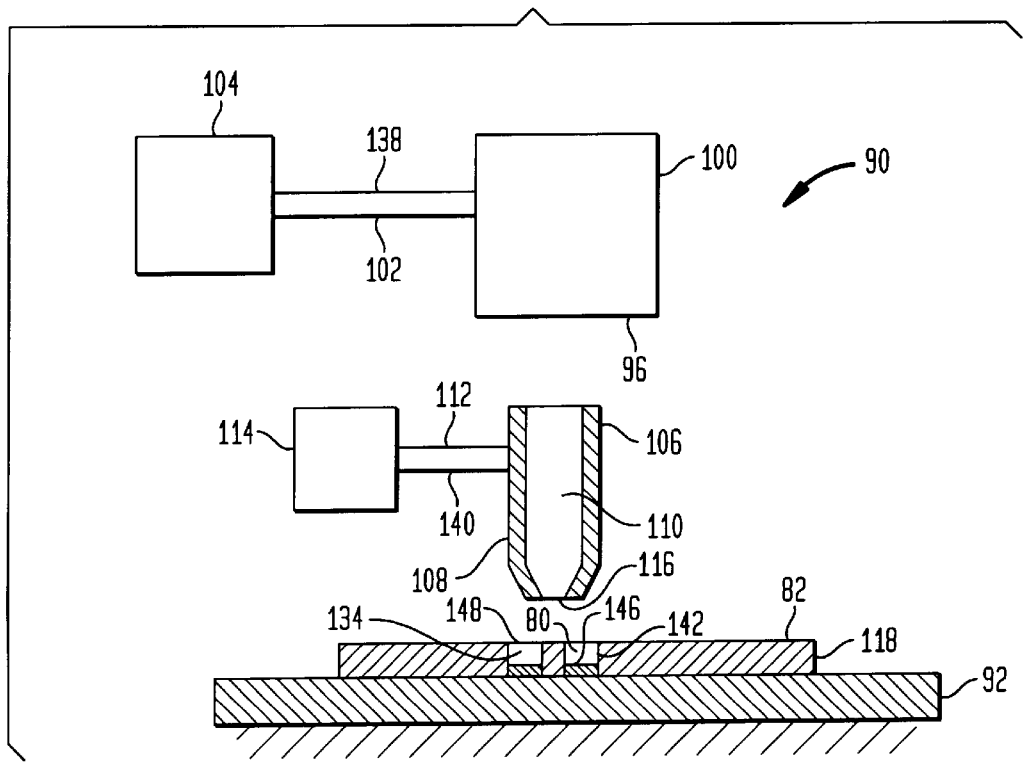
FIG. 3 is a cross sectional view of the system of FIG. 1, at yet another stage of operation.

FIG. 3 illustrates the system 90 after the vacuum collet 106 has made the imprint 134 and after the pick and place control system 114, 140 has lifted the collet 106 from the film layer 118. As shown in. FIG. 4, the imprint 134 has concentric imprinted sides 148, 142 and an imprinted bottom 146. The bottom 146 resides at a different plane than the nominal top surface 82 of the film layer 118. The film layer 118 at this point has a cavity 80 (FIG. 3) at its otherwise planar surface 82 where the imprint 134 is located. Next, the operative arm 140 moves the vacuum collet 106 out from between the camera 100 and the film layer 118 to a remote position (not illustrated). This leaves the vision camera 100 alone focusing down on the imprinted film layer 118 with no visual obstructions. The camera 100 can view the imprint 134 directly without being obstructed by the collet 106.

Figure 5:
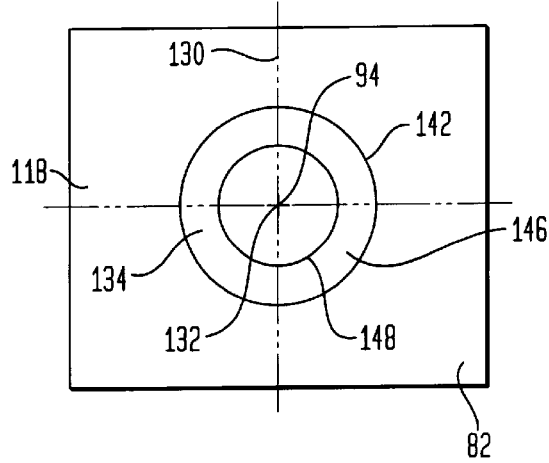
FIG. 5 is another top view of the film layer of FIG. 4, with alignment crosshairs moved to an aligned position.

The vision camera 100 is then aligned to the actual attach position by aligning itself to the imprint of the vacuum collet 134 using visual crosshairs 130. FIG. 5 depicts the crosshairs 130 after the vision camera 100 has been aligned with the imprint 134. When the center 132 of the crosshairs 130 is at the center of the imprint 134, then the vision camera 100 and the imprint 134 are aligned. The vision control system 104 may utilize vision software to control the vision camera 100 in this alignment process. Alternatively, the alignment may be performed manually.

Subsequently, the vacuum collet 106 is swung back into its first position using the pick and place control system 114 together with the operative arm 140. This places the vacuum collet 106 between the vision camera 100 and the support structure 92 at the imprint position 134.

At this point, the vision camera 100 and the vacuum collet 106 are aligned. After alignment is complete, the film layer 118 may be replaced with the semiconductor workpiece (not illustrated). The workpiece may be supported on the illustrated support structure 92 or on another support structure. In a preferred embodiment of the invention, the workpiece may be located on a movable film or sheet. In manufacturing operations, the vacuum collet 106 attaches to the workpiece precisely at the point where the imprint 134 was made previously, thus allowing a user to pick up the workpiece with confidence that the visual depiction generated by the vision camera 100 represents the actual pick and place location 134 of the vacuum collet tip 116 on the workpiece. The workpiece then may be placed in a desired location by referring to the image generated by the vision camera 100. If desired, numerous workpieces may be handled by the pick and place equipment 106 based on a single alignment of the camera 100 with respect to the pick and place equipment 106.

The invention may be practiced with a variety of workpieces, including semiconductor chips, laser bars, and semiconductor wafer products and preforms, including products with integrated circuits formed therein.

The scope of the present invention is not to be considered as limited by the specifics of the particular structures which have been described and illustrated, but is only limited by the scope of the appended claims.

What is claimed as new and desired to be protected by Letters Patent of the United States is:

1. A method of aligning an optical device, said method comprising steps of:

moving a pick and place device to a first position above an attach position on a film layer;

using said pick and place device to form an imprint in the film layer, such that said imprint indicates said attach position;

subsequently, moving said pick and place device to a second position;

aligning an optical device to said imprint; and returning said pick and place device to said attach position.

2. The method according to claim 1, wherein said imprint is formed by moving said pick and place device toward said film layer.

3. The method according to claim 1, wherein said optical device is controlled by a vision control system.

4. The method according to claim 1, wherein said film layer includes tape.

5. The method according to claim 4, wherein said film layer includes adhesive material.

6. The method according to claim 5, wherein said film layer maintains said imprint during said step of aligning said optical device.

7. A method of handling a semiconductor product, said method comprising steps of:

moving a vacuum collet to a first position between a vision camera and a film layer, where said first position is above an attach position on said film layer;

using said vacuum collet to form an imprint in the film layer, such that said imprint indicates said attach position on a semiconductor workpiece;

subsequently, moving said vacuum collet to a second position;

aligning said vision camera to said imprint;

removing said film layer;

placing a semiconductor workpiece in a place of said film layer; and using said vacuum collet to move said semiconductor product to a desired location.

8. The method according to claim 7, wherein a movement of said semiconductor product is controlled by said vision camera.

9. The method according to claim 7, wherein said semiconductor product includes a semiconductor wafer product.

10. The method according to claim 7, wherein said semiconductor product includes a semiconductor chip containing an integrated circuit.

11. The method according to claim 7, wherein said semiconductor product includes a laser bar.

* * * * *